(12) United States Patent
Kim et al.

(10) Patent No.: US 12,313,678 B2
(45) Date of Patent: May 27, 2025

(54) TEST APPARATUS FOR A SEMICONDUCTOR PACKAGE

(71) Applicant: TSE CO., LTD., Chungcheongnam-do (KR)

(72) Inventors: Min Cheol Kim, Chungcheongnam-do (KR); Sol Lee, Chungcheongnam-do (KR)

(73) Assignee: TSE CO., LTD., Chungcheongnam-do (KR)

( * ) Notice: Subject to any disclaimer, the term of this patent is extended or adjusted under 35 U.S.C. 154(b) by 149 days.

(21) Appl. No.: 18/152,972

(22) Filed: Jan. 11, 2023

(65) Prior Publication Data
US 2023/0384368 A1    Nov. 30, 2023

(51) Int. Cl.
*G01R 31/28*    (2006.01)
*G01R 1/04*    (2006.01)

(52) U.S. Cl.
CPC ....... *G01R 31/2896* (2013.01); *G01R 1/0433* (2013.01); *G01R 31/2893* (2013.01)

(58) Field of Classification Search
CPC .............. G01R 1/0433; G01R 31/2893; G01R 31/2896
See application file for complete search history.

(56) References Cited

U.S. PATENT DOCUMENTS

| | | |
|---|---|---|
| 9,678,158 B2 | 6/2017 | Chen |
| 10,615,056 B2 | 4/2020 | Chew |
| 11,609,244 B2 | 3/2023 | Oh et al. |
| 2006/0158179 A1* | 7/2006 | Chyan ................. G01R 31/2893 324/750.25 |
| 2013/0168929 A1* | 7/2013 | Erickson ................. H01L 21/68 29/559 |
| 2015/0260793 A1 | 9/2015 | Chen |
| 2017/0010324 A1* | 1/2017 | Kim ................... G01R 31/2893 |
| 2017/0250171 A1 | 8/2017 | Yu et al. |
| 2018/0024188 A1 | 1/2018 | Cruzan et al. |
| 2018/0204741 A1 | 7/2018 | Chew |

(Continued)

FOREIGN PATENT DOCUMENTS

KR    10-1999-0019255 A    3/1999
KR    10 2015 0106848 A    9/2015

(Continued)

OTHER PUBLICATIONS

Notice of Allowance dated Mar. 22, 2023 (8 pages) out of corresponding Taiwanese Application 112101369.

(Continued)

*Primary Examiner* — Neel D Shah
*Assistant Examiner* — Adam S Clarke
(74) *Attorney, Agent, or Firm* — Crowell & Moring LLP; John C. Freeman

(57) ABSTRACT

An apparatus for testing a package-on-package (POP) type semiconductor package that includes a vacuum picker that has vacuum holes that communicate with an insulation pad hole, the vacuum picker includes a body part made of silicone or rubber, and a socket contact part and a package contact part made of any one of polyimide film, engineering plastic, and synthetic resin, and the socket contact part is attached to a mounting groove by an adhesive tape, such that the vacuum picker is coupled to an upper socket.

7 Claims, 10 Drawing Sheets

(56) References Cited

U.S. PATENT DOCUMENTS

2020/0227379 A1  1/2020  Huang et al.
2021/0280544 A1  9/2021  Chen et al.
2021/0302468 A1  9/2021  Oh et al.

FOREIGN PATENT DOCUMENTS

| KR | 10 1555965 B1 | | 9/2015 |
|---|---|---|---|
| KR | 101667523 B1 | * | 10/2016 |
| KR | 10-2022-0057870 A | | 5/2022 |
| TW | 202136784 A | | 10/2021 |
| TW | M625448 U | | 4/2022 |

OTHER PUBLICATIONS

Office Action dated Sep. 2, 2024 out of corresponding Korean Patent Application No. 10-2022-0063526.

* cited by examiner (a)

(b)

TEST APPARATUS FOR A SEMICONDUCTOR PACKAGE

This application claims under 35 U.S.C. § 119 (a) the benefit of the filing date of Korean Patent Application No. 10-2022-0063526, filed on May 24, 2022, the entire contents of which are incorporated herein by reference.

BACKGROUND OF THE INVENTION

TECHNICAL FIELD

The present disclosure relates to a testing apparatus of a semiconductor package, and more particularly, to an apparatus for testing a semiconductor package, which tests whether a package-on-package (POP) type semiconductor package, which is made by stacking a lower semiconductor package and an upper semiconductor package in an upward/downward direction, operates normally.

BACKGROUND ART

A semiconductor package is made by integrating fine electronic circuits with high density and subjected to a test process to test whether the electronic circuit is normal during a manufacturing process. The test process is a process of testing whether the semiconductor package operates normally and sorting the semiconductor packages into good products and defective products.

To test the semiconductor package, a test apparatus is used to electrically connect a terminal of the semiconductor package and a tester configured to apply a test signal. The test apparatus has various structures in accordance with the types of semiconductor packages that are test targets.

Recently, the use of package-on-package (POP) type semiconductor packages, which minimize sizes of components and quickly transmit signals, has been increased, and thus there is a continuously increasing demand for test apparatuses for testing the semiconductor packages.

As illustrated in FIG. 1, a test apparatus 100 in the related art for testing the package-on-package type semiconductor package includes lower and upper sockets 40 and 60 configured to transmit electrical signals, a pusher 50 on which the upper socket is mounted, and a vacuum picker 70 integrally fastened to the upper socket 60 to pick up a lower package 10. The lower socket 40 is installed on a tester 30 so as to be electrically connected to the lower semiconductor package 10 (hereinafter, referred to as a 'lower package'). An upper semiconductor package 20 (hereinafter, referred to as an 'upper package') is mounted on an upper portion of the upper socket so as to be electrically connected to the upper socket 60.

In the test apparatus, in a state in which the pusher 50 moves downward and the vacuum picker 70 picks up the lower package 10 that is the test target, the vacuum picker 70 places the lower package 10 on the upper portion of the lower socket 40. Next, the upper socket 60 pushes the lower package 10 by the pusher 50, such that a second conductive part 61 of the upper socket 60 and an upper terminal 12 of the lower package 10 are connected to each other. Therefore, the tester 30, the lower socket 40, the lower package 10, the upper socket 60, and the upper package 20 are electrically connected, and the electrical test is performed.

In the general apparatus for testing a semiconductor package in the related art, the picker picks up the semiconductor package, which is the test target, and then places the semiconductor package on the test socket. Thereafter, the picker moves to pick up another semiconductor package, and the pusher pushes the semiconductor package positioned on the test socket, such that the electrical test is performed. That is, in the general apparatus for testing a semiconductor package in the related art, the vacuum picker and the pusher are separately operated, the vacuum picker performs only the pick-and-place (pick & place) function, and the vacuum picker picks up the semiconductor package only for a short period of time.

In contrast, in the test apparatus for testing the package-on-package type semiconductor package, the vacuum picker and the pusher are integrated, and the vacuum picker coupled to the pusher simultaneously serves to pick up the semiconductor package, which is the test target, load (place) the semiconductor package, and push the semiconductor package. Therefore, the vacuum picker has a structure that comes into contact with the semiconductor package for a long period of time. Particularly, in the case of a reliability test, the vacuum picker is kept in contact with the lower package for one to two weeks.

In the test apparatus for testing the package-on-package type semiconductor package, the vacuum picker 70 is manufactured by using silicone to protect the semiconductor package and improve vacuum picking performance. Because of the properties of the silicone, a so-called sticky phenomenon occurs in which the lower package adheres to the vacuum picker. To prevent the sticky phenomenon, in the related art, a method of coating a surface of the vacuum picker, which comes into close contact with the semiconductor package, with an antistatic or special coating has been performed. However, the problem of the sticky phenomenon has not been solved.

Recently, as illustrated in FIG. 2A, a contact part 720 is provided on a lower surface of a body part 710 of the vacuum picker 70, which comes into close contact with the lower semiconductor package 10, and the contact part 720 is configured as an anti-adhesion member made of any one of polyimide film, engineering plastic, and synthetic resin. The contact part 720 configured as the anti-adhesion member is attached to the body part 710 to prevent the sticky phenomenon.

However, as illustrated in FIG. 2B, in the test apparatus for testing the package-on-package type semiconductor package in which the vacuum picker 70 is kept in contact with the lower package for a long period of time, the body part 710 of the vacuum picker 70 is compressed by vacuum pressure for a long period of time. For this reason, silicone oil is eluted from the body part made of silicone and flows downward along inner and outer lateral surfaces of the body part 710, as indicated by arrows A. The silicone oil, which flows downward, is introduced between the vacuum picker and the lower package and accumulated between the lower package 10 and the contact part 720 of the vacuum picker 70 (S exemplarily indicates that the silicone oil is accumulated), which still causes the sticky phenomenon in which the vacuum picker 70 and the lower package 10 adhere to each other.

Therefore, recently, as illustrated in FIG. 3A, a package contact part 730 having a width larger than a width of the body part 710 is provided, and the body part 710 is attached to a central portion of an upper surface of the package contact part 730. Further, a space, which accommodates silicone oil eluted from the inner and outer lateral surfaces of the body part 710, is formed in an outer peripheral portion of the upper surface of the package contact part 730, and the body part 710 is not attached to the outer peripheral portion, such that the sticky phenomenon in which the vacuum picker 70 and the lower package 10 adhere to each other is prevented to some extent.

The body part 710 of the vacuum picker 70 needs to have an elastic section t1 at an appropriate level to maintain picking power for picking up the lower package 10. However, as illustrated in FIG. 3B, when the body part 710 is used repeatedly over a long period of time, a thickness of the body part 710 of the vacuum picker 70 is decreased from 't1' to 't2', and the picking power of the vacuum picker 70 decreases. For this reason, there is a problem in that the contact between the vacuum picker 70 and the lower package 10 becomes unstable, and a pick-up error occurs in which the vacuum picker 70 cannot properly pick up the lower package 10.

In addition, in the test apparatus for testing the package-on-package type semiconductor package in the related art, the vacuum picker 70 is integrally fastened to the upper socket 60. For this reason, both the upper socket and the vacuum picker need to be replaced even though only any one of the upper socket 60 and the vacuum picker 70 has a defect, which causes a problem in that replacement costs are increased.

RELATED ART (Patent Document 1) Korean Patent Application Laid-Open No. 2015-0106848 (Sep. 22, 2015)
(Patent Document 2) Korean Patent No. 10-1555965 (Sep. 25, 2015)

SUMMARY OF THE INVENTION

The present disclosure has been contrived in consideration of the above-mentioned situations, and an object of the present disclosure is to provide an apparatus for testing a semiconductor package, which is capable of precisely testing a package-on-package type semiconductor package that operates at high speed.

Another object of the present disclosure is to provide an apparatus for testing a semiconductor package, which is capable of allowing a vacuum picker to stably pick up and easily detach a lower package and extending a lifespan of the vacuum picker by reducing a degree to which an elastic section of the vacuum picker is reduced even though the vacuum picker is used repeatedly over a long period of time.

Technical Solution

To achieve the above-mentioned objects, the present disclosure provides an apparatus for testing a package-on-package (POP) type semiconductor package, the apparatus including: a lower socket mounted on a tester and configured to be connected to a lower package placed at an upper side thereof; an upper socket mounted on a pusher and configured to mount an upper package, the upper socket being configured to be connected to the lower package placed below the upper socket; and a vacuum picker coupled to the upper socket and configured to pick up the lower package, in which a lower surface of the upper socket has an insulation pad hole, and a mounting groove provided to surround the insulation pad hole, in which the vacuum picker has vacuum holes that communicate with the insulation pad hole, in which the vacuum picker includes: a body part made of silicone or rubber; and a socket contact part and a package contact part made of any one of polyimide film, engineering plastic, and synthetic resin, and in which the socket contact part is attached to the mounting groove by means of an adhesive tape, such that the vacuum picker is coupled to the upper socket.

The adhesive tape may have a width smaller than a width of the mounting groove, and the socket contact part may have a width equal to the width of the mounting groove.

The adhesive tape may be attached to a central portion of the mounting groove.

A first tape accommodation groove may be formed in a central portion of the mounting groove and accommodate a part of a thickness of the adhesive tape.

A second tape accommodation groove may be formed in a central portion of an upper surface of the socket contact part and accommodate a part of a thickness of the adhesive tape.

A depth of the mounting groove may be larger than a sum of a thickness of the adhesive tape and a thickness of the socket contact part.

An area of the package contact part may be 5% or more of an area of an upper surface of the lower package.

According to the apparatus for testing a semiconductor package according to the present disclosure, the socket contact part and the package contact part, which are made of an anti-adhesion material, are respectively provided on the upper and lower portions of the body part of the vacuum picker, and the socket contact part and the package contact part are larger in width than the body part, which makes it possible to prevent oil or the like eluted from the adhesive tape or the body part from flowing toward the lower package. Therefore, it is possible to prevent the sticky phenomenon in which the lower package adheres to the vacuum picker, thereby stably picking up the lower package and easily detaching the lower package.

In addition, according to the apparatus for testing a semiconductor package according to the present disclosure, the socket contact part made of a hard material is provided on the upper surface of the body part made of silicone or rubber, which makes it possible to reduce the extent to which the body part is shrunk because of the repeated use of the vacuum picker. Therefore, the vacuum picker may stably pick up the lower package without a pick-up error, and thus a lifespan of the vacuum picker may be extended.

In addition, according to the apparatus for testing a semiconductor package according to the present disclosure, the vacuum picker may be easily separated from or coupled to the upper socket, such that the convenience of coupling the vacuum picker may be improved. Further, when any one of the upper socket and the vacuum picker has a defect, only the component having the defect may be replaced, which makes it possible to reduce replacement costs.

BRIEF DESCRIPTION OF THE DRAWINGS

FIG. 2a is a view illustrating a situation in which in the test apparatus in the related art, silicone is eluted from a vacuum picker, and FIG. 2b is a view illustrating when a sticky phenomenon occurs in the situation of FIG. 2a.

FIG. 3a is a view illustrating a situation in which in the test apparatus in the related art, a body part, which is an elastic section of the vacuum picker, is shrunk, and FIG. 3b is a view illustrating when a pick-up error occurs in the situation of FIG. 3a.

FIG. 6 is a view illustrating a structure of an upper socket according to an embodiment of the present disclosure, in which FIG. 6A illustrates an upper surface, and FIG. 6B illustrates a lower surface.

FIG. 7 is a view illustrating a structure of a vacuum picker according to the embodiment of the present disclosure, in which FIG. 7A is a cross-sectional view, and FIG. 7B is a perspective view.

DETAILED DESCRIPTION

Figure 1:
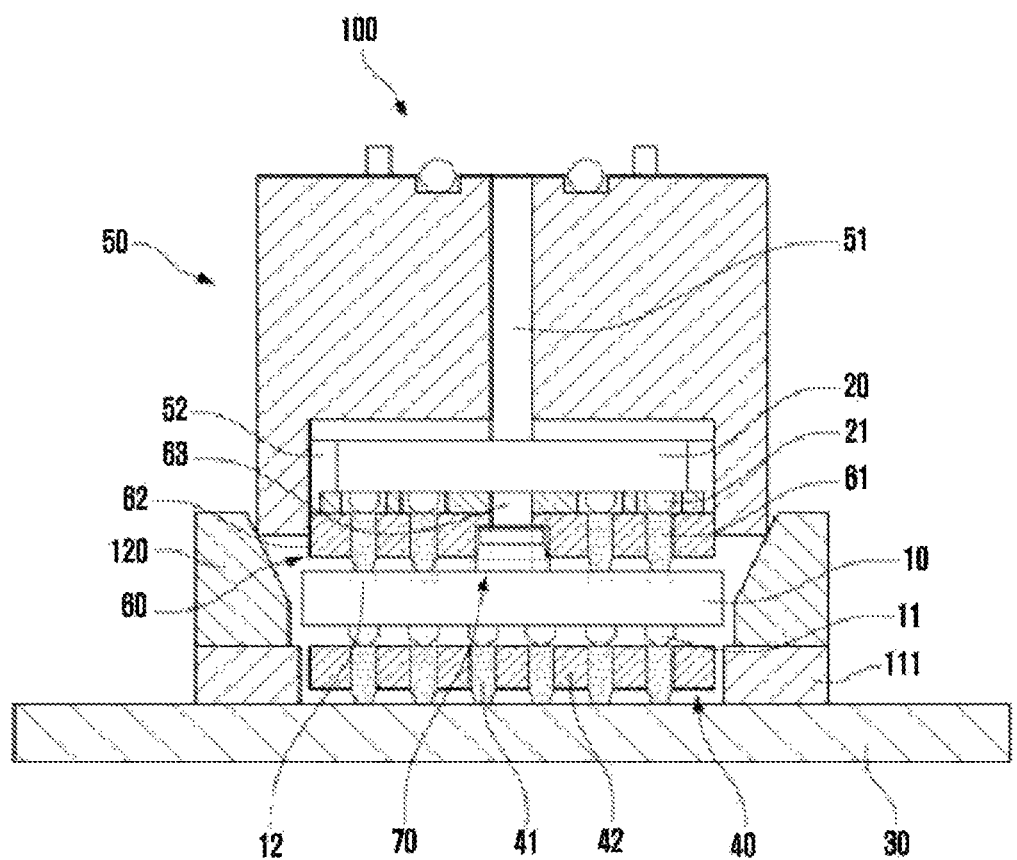
FIG. 1 is a view schematically illustrating an apparatus for testing a package-on-package type semiconductor package in the related art.
Figure 2:
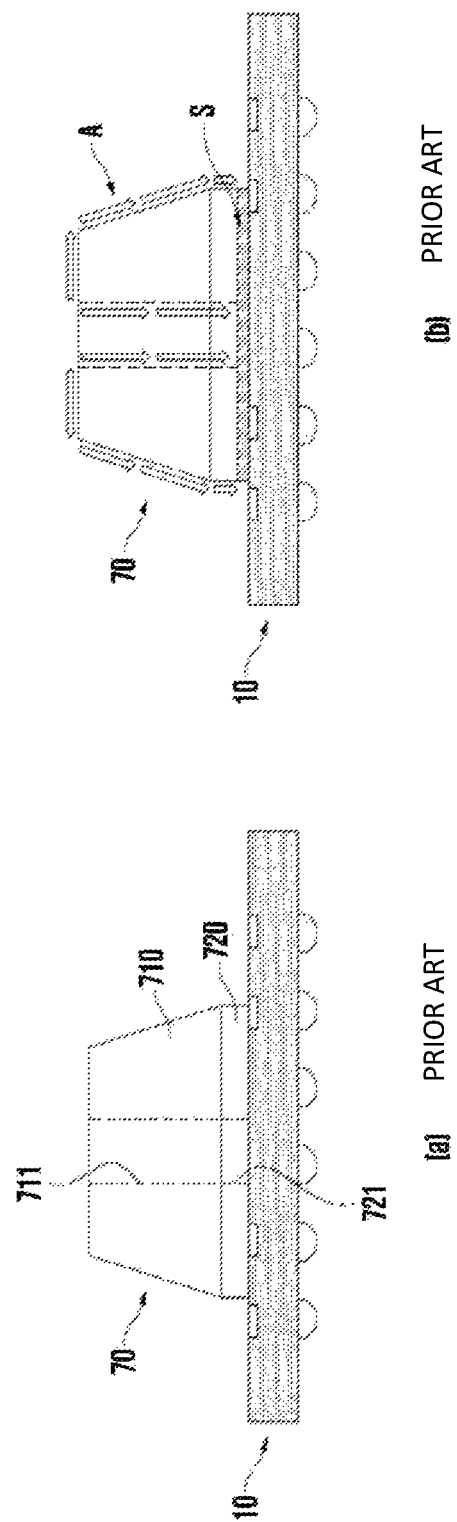
Figure 3:
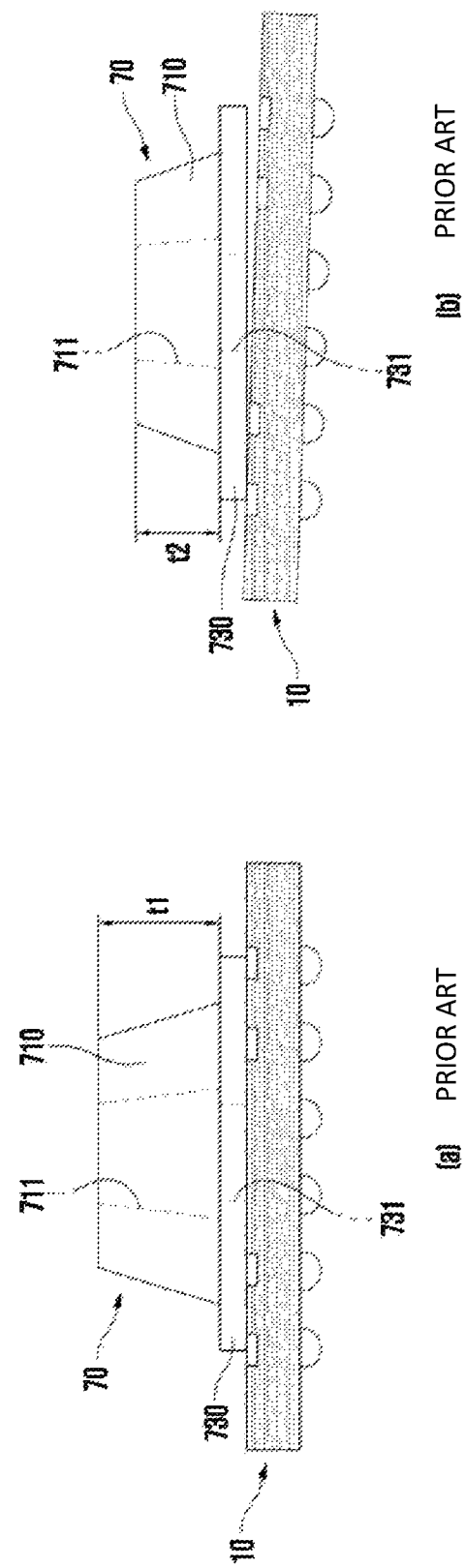

Hereinafter, an apparatus for testing a semiconductor package according to the present disclosure will be described in detail with reference to the drawings.

the present disclosure may be variously modified and may have various exemplary embodiments, and particular exemplary embodiments illustrated in the drawings will be described in detail below.

However, the description of the exemplary embodiments is not intended to limit the present disclosure to the particular exemplary embodiments, but it should be understood that the present disclosure is to cover all modifications, equivalents and alternatives falling within the spirit and technical scope of the present disclosure.

When one constituent element is described as being "coupled" or "connected" to another constituent element, it should be understood that one constituent element can be coupled or connected directly to another constituent element, and an intervening constituent element can also be present between the constituent elements. When one constituent element is described as being "coupled directly to" or "connected directly to" another constituent element, it should be understood that no intervening constituent element is present between the constituent elements.

The terms used in the present specification are used only for the purpose of describing particular embodiments and are not intended to limit the present disclosure. Singular expressions include plural expressions unless clearly described as different meanings in the context.

In the present specification, it should be understood the terms "comprises," "comprising," "includes," "including," "containing," "has," "having" or other variations thereof are inclusive and therefore specify the presence of stated features, integers, steps, operations, elements, components, or combinations thereof, but do not preclude the presence or addition of one or more other features, integers, steps, operations, elements, components, or combinations thereof.

The terms such as "first" and "second" may be used to describe various constituent elements, but the constituent elements should not be limited by the terms. These terms are used only to distinguish one constituent element from another constituent element.

In addition, the constituent elements of the embodiment described with reference to the drawings are not restrictively applied to the corresponding embodiment but may be implemented to be included in another embodiment within the scope in which the technical spirit of the present disclosure is maintained. In addition, even though a separate description is omitted, the constituent elements may, of course, be implemented in one embodiment made by combining a plurality of embodiments.

In addition, in the description of the exemplary embodiments with reference to the accompanying drawings, the same constituent elements will be designated by the same or relevant reference numerals regardless of reference numerals, and a duplicated description thereof will be omitted. In the description of the present disclosure, the specific descriptions of publicly known related technologies will be omitted when it is determined that the specific descriptions may unnecessarily obscure the subject matter of the present disclosure.

Figure 4:
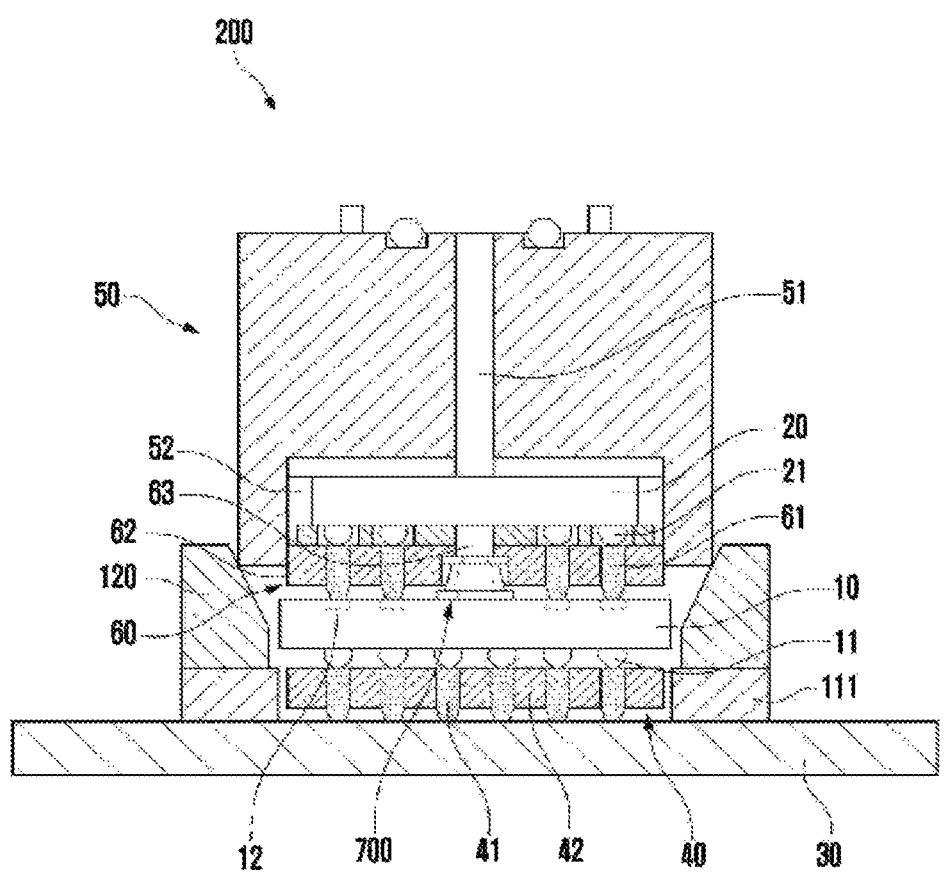
FIG. 4 is a view schematically illustrating an apparatus for testing a package-on-package type semiconductor package according to the present disclosure.
Figure 5:
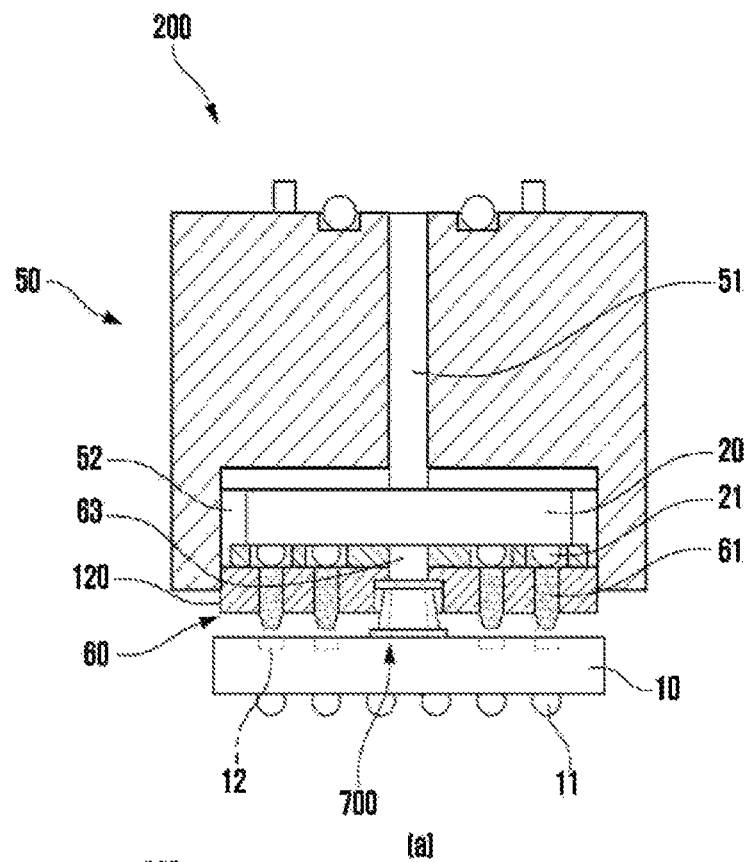
FIG. 5 is a view for explaining an operation of the apparatus for testing a package-on-package type semiconductor package according to the present disclosure.
Figure 5:
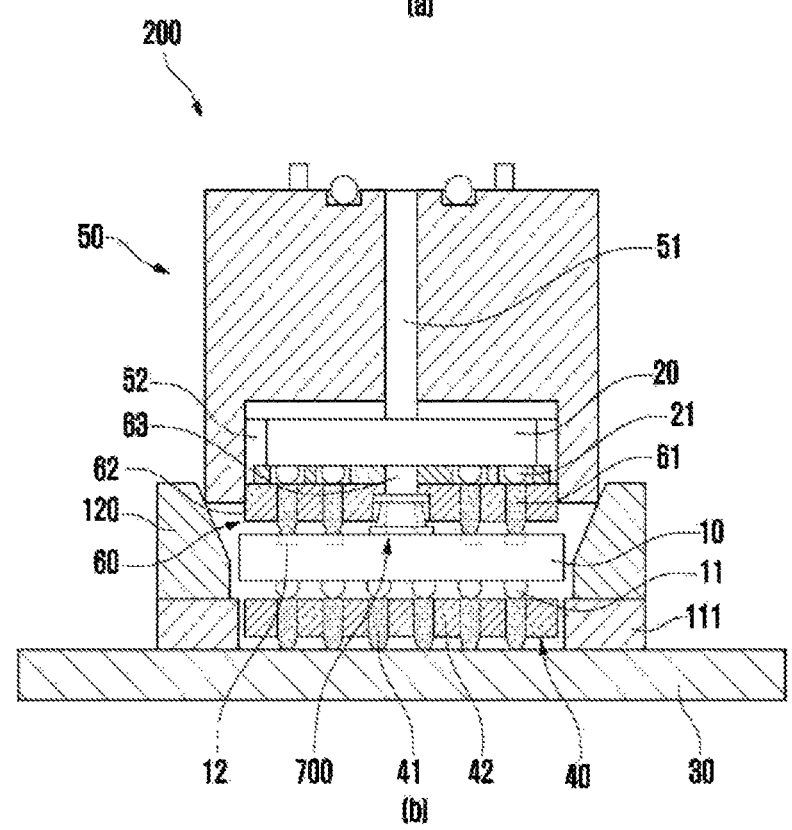

FIG. 4 is a view schematically illustrating an apparatus for testing a package-on-package type semiconductor package according to the present disclosure, and FIG. 5 is a view for explaining an operation of the apparatus for testing a package-on-package type semiconductor package according to the present disclosure. However, FIGS. 4 and 5 schematically illustrate the apparatus for testing a package-on-package type semiconductor package to easily explain the structure and operation of the apparatus for testing a package-on-package type semiconductor package. A configuration in which an upper socket and a vacuum picker according to the present disclosure are coupled will be described with reference to FIGS. 8 and 9.

Figure 6:
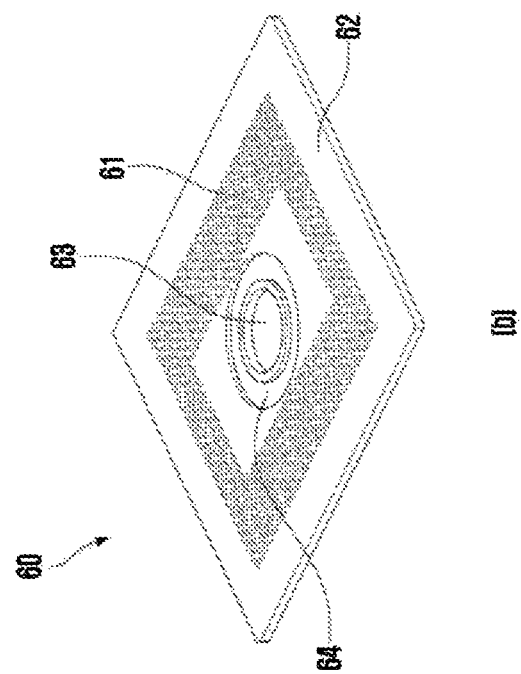
Figure 6:
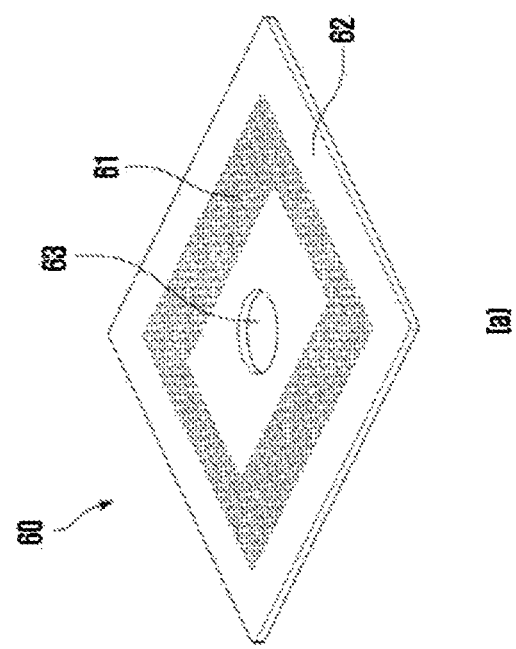
Figure 7:
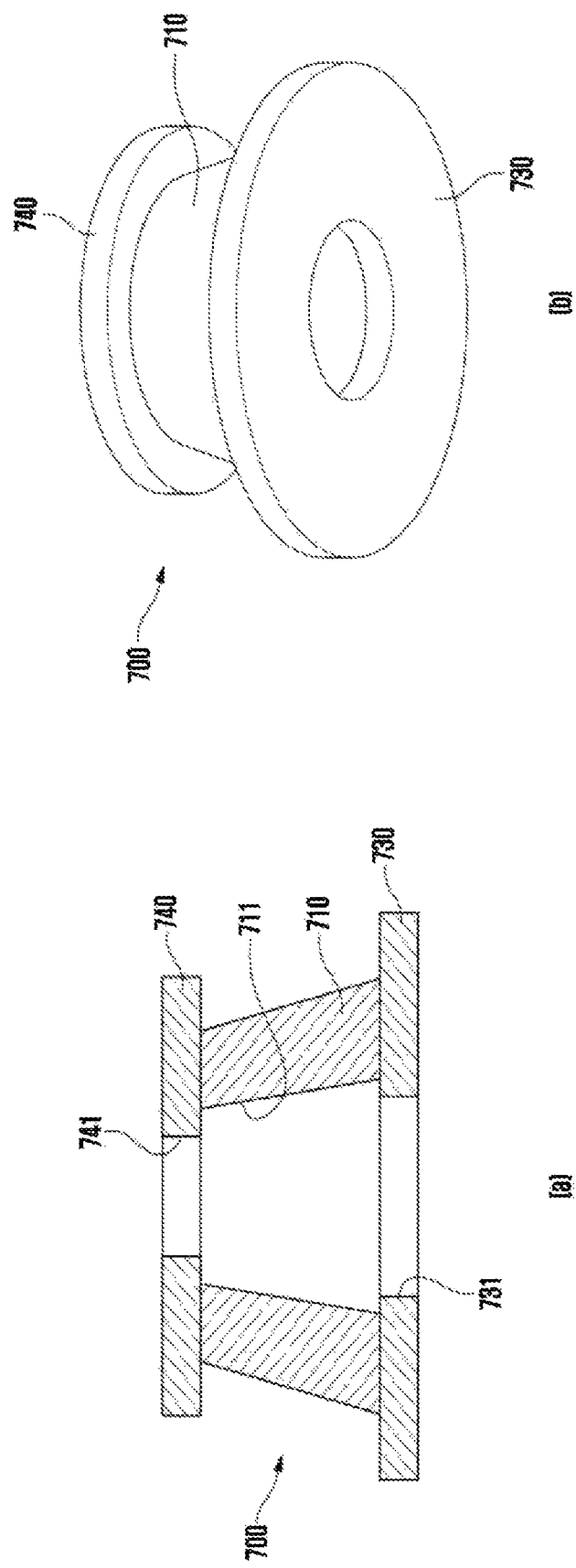
Figure 8:
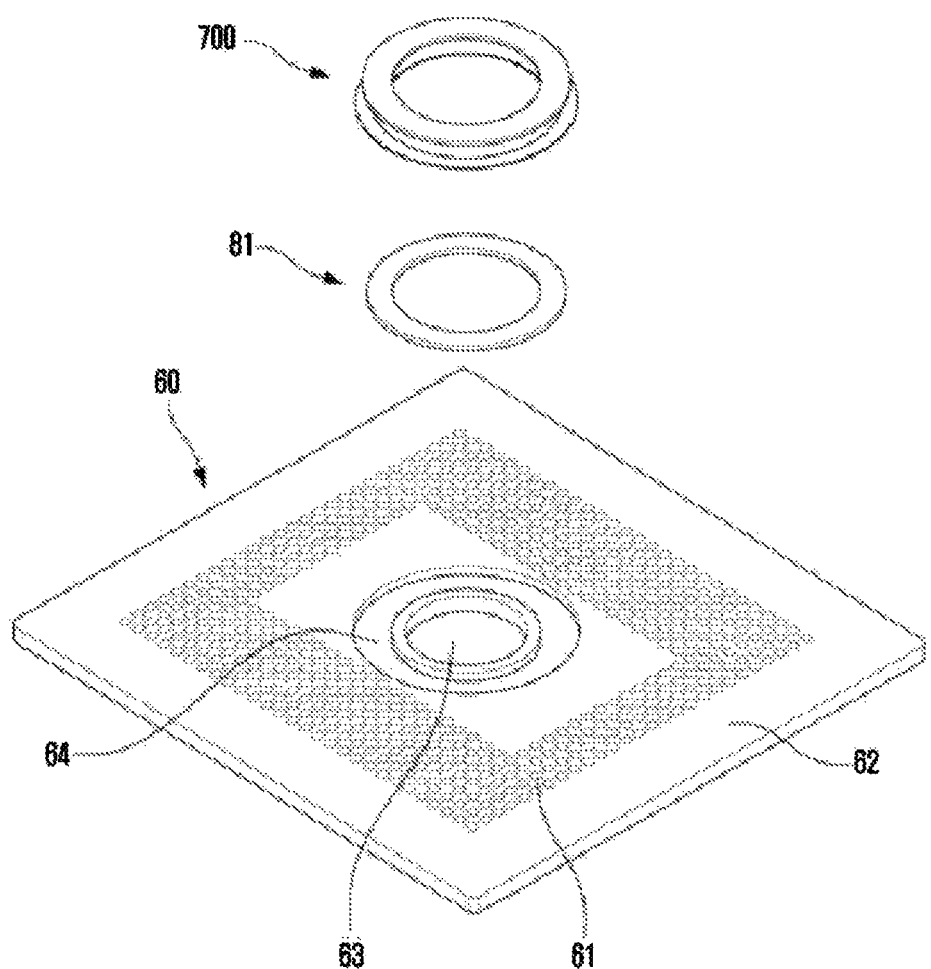
FIGS. 8 and 9 are views illustrating a coupling relationship between the upper socket and the vacuum picker according to the embodiment of the present disclosure.
Figure 9:
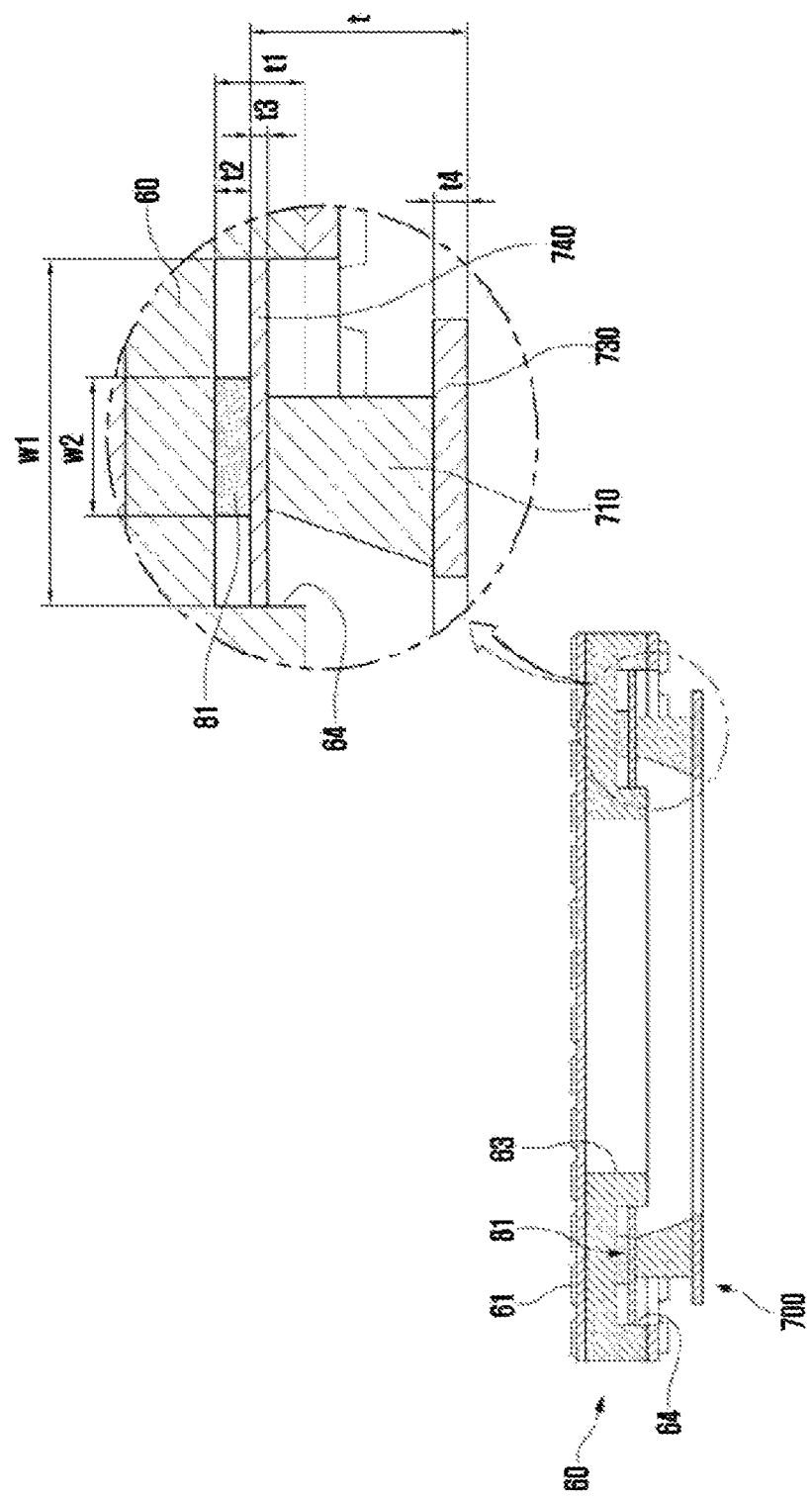

Further, FIG. 6 is a view illustrating a structure of an upper socket according to an embodiment of the present disclosure, in which FIG. 6A illustrates an upper surface, and FIG. 6B illustrates a lower surface, FIG. 7 is a view illustrating a structure of a vacuum picker according to the embodiment of the present disclosure, in which FIG. 7A is a cross-sectional view, and FIG. 7B is a perspective view, and FIGS. 8 and 9 are views illustrating a coupling relationship between the upper socket and the vacuum picker according to the embodiment of the present disclosure.

As illustrated in FIG. 4, an apparatus 200 for testing a package-on-package type semiconductor package is used to test a package-on-package (POP) type semiconductor package and tests a lower package 10 by using an upper package 20 that is sorted in advance as a good product. The apparatus 200 may electrically mediate the package-on-package (POP) type semiconductor package and the tester 30 configured to generate test signals.

The apparatus 200 for testing a semiconductor package may include: a lower socket 40 mounted on the tester 30; a socket housing 111 and a guide housing 120 on which the lower socket 40 is mounted; a pusher 50 on which an upper socket 60 is mounted, the pusher 50 being configured to be movable by receiving movement power from a drive part (not illustrated); the upper socket 60 coupled to the pusher 50; and a vacuum picker 700 mounted on the upper socket 60 and configured to pick up the lower package 10.

The lower socket 40 is mounted on the tester 30 and electrically connects the tester 30 and the lower package 10 positioned at an upper side thereof. The lower socket 40 is disposed in a socket housing 111 and includes a first conductive part 41 and an insulation part 42.

The first conductive part 41 may be provided in the form in which conductive particles are aligned in an elastic insulating material. Alternatively, the first conductive part 41 may be provided in the form of a pogo pin embedded with a spring.

The pusher 50 may receive movement power from the drive part (not illustrated) and move toward the lower socket 40 or move away from the lower socket 40. The pusher 50 has therein a chamber 52 configured to accommodate the upper package 20, and a vacuum passageway 51 configured to transmit vacuum pressure. The vacuum passageway 51 may be connected to an external vacuum pressure generation device (not illustrated) and transmit vacuum pressure, which is generated from the vacuum pressure generation device, to the vacuum picker 700.

The upper socket 60 is coupled to one side of the pusher 50 so as to seal the chamber 52. The upper socket 60 mounts the upper package 20 placed in the chamber 52 (the upper package may be a good package that is sorted in advance). During the test, the upper socket 60 is electrically connected to the lower package 10 placed below the upper socket 60. As illustrated in FIG. 6, the upper socket 60 includes an insulation pad 62 configured to cover the chamber 52, and a plurality of second conductive parts 61 supported by the insulation pad 62.

The insulation pad 62 may be made of an elastic insulating material or an inelastic insulating material. The insulation pad 62 made of an inelastic insulating material is advantageous in pushing the lower package 10 against the lower socket 40 when the upper socket 60 is connected to the lower package 10. When the insulation pad 62 made of an inelastic insulating material stably pushes the lower package 10, a lower terminal 11 of the lower package 10 may be stably connected to the first conductive part 41 of the lower socket 40. Polyimide, engineering plastic, or other various inelastic insulating materials may be used as the inelastic insulating material. In contrast, the insulation pad 62 may be made of an elastic insulating material. Polymer materials, for example, silicone rubber or the like, which has heat resistance and a crosslinking structure, may be used as the elastic insulating material.

The second conductive part 61 penetrates the insulation pad 62 in a thickness direction and is supported by the insulation pad 62. The second conductive part 61 may be provided in the form in which a plurality of conductive particles is contained in an elastic insulating material. A material identical to the elastic insulating material of the insulation pad 62 may be used as the elastic insulating material that constitutes the second conductive part 61.

An insulation pad hole 63 is provided in a central portion of the insulation pad 62. The insulation pad hole 63 communicates with the vacuum passageway 51 of the chamber 52 so that the vacuum pressure in the chamber 52 may be transmitted.

A mounting groove 64 is provided in a lower surface of the upper socket 60, and the vacuum picker 700 is mounted in the mounting groove 64 (in this case, the lower surface of the upper socket means a portion facing the lower package 10, and the upper surface of the upper socket means a portion facing the upper package 20). The mounting groove 64 is provided in the form of an annular groove that surrounds the insulation pad hole 63.

As described below, the vacuum picker 700 is attached to and mounted in the mounting groove 64 by means of an adhesive tape 81, and the mounting groove 64 is formed in the lower surface of the upper socket 60. The vacuum pressure or release pressure generated by the operation of the vacuum pressure generation device is transmitted to the vacuum picker 700 through the vacuum passageway 51, the chamber 52, and the insulation pad hole 63. The vacuum picker 700 moves downward while maintaining a vacuum state and picks up the lower package 10 that is a test target.

When the pusher 50 pushes the upper socket 60, the vacuum picker 700 pushes the lower package 10 while being compressed or releases the vacuum state, such that the vacuum picker 700 may place the completely tested lower package 10 on a loading device (not illustrated).

FIG. 7 is a cross-sectional view and a perspective view illustrating a structure of the vacuum picker according to the embodiment of the present disclosure. As illustrated in the drawing, the vacuum picker 700 according to the embodiment of the present disclosure has vacuum holes 711, 731, and 741 that communicate with the insulation pad hole 63 of the upper socket 60. The vacuum picker 700 includes a body part 710 made of silicone or rubber, and a socket contact part 740 and a package contact part 730 each made of any one of polyimide film, engineering plastic, and synthetic resin.

The body part 710 defines a body of the vacuum picker 700. The first vacuum hole 711 is penetratively formed in a central portion of the body part 710 having a cylindrical shape or a truncated conical shape. The vacuum pressure or release pressure provided by the operation of the vacuum pressure generation device is transmitted to the first vacuum hole 711 through the insulation pad hole 63, the chamber 52, and the vacuum passageway 51 of the pusher. The body part 710 is made of rubber or silicone to improve vacuum picking performance. Further, in the present specification, an upper surface of the body part 710 means a portion facing the upper socket 60, and a lower surface of the body part 710 means a portion facing the lower package 10.

The package contact part 730 is coupled to the lower surface of the body part 710. The package contact part 730 is a portion that is in contact with the lower package 10. The package contact part 730 is shaped such that the second vacuum hole 731 connected to the first vacuum hole 711 of the body part 710 is penetratively formed in a central portion of a circular plate.

The package contact part 730 has a larger width than the body part 710. The lower surface of the body part 710 is coupled to an upper surface of the package contact part 730 so that an outer edge portion of the upper surface of the package contact part 730 is exposed. Therefore, because the package contact part 730 is shaped to cover the lower surface of the body part 710, a diameter of the second vacuum hole 731 of the package contact part 730 is smaller than a diameter of the first vacuum hole 711 of the body part 710.

To more stably pick up the lower package 10, a contact area of the package contact part 730 being in contact with the lower package 10 may be 5% or more of an area of an upper surface of the lower package 10. In this case, the upper surface of the lower package 10 means a portion facing the upper socket 60.

When a thickness t4 of the package contact part 730 increases, an overall load of the vacuum picker 700 increases, which may cause damage to the lower package 10. Therefore, the thickness t4 of the package contact part may be a thickness of about 5% to 10% of an overall thickness t of the vacuum picker 700.

The package contact part 730 may be made of a hard anti-adhesion material such as polyimide film, engineering plastic, or synthetic resin. Because the portion of the vacuum picker 700, which comes into close contact with the lower package, is made of an anti-adhesion material, it is possible to prevent, to some extent, the lower package from adhering to the vacuum picker 700.

Further, the package contact part 730 according to the embodiment of the present disclosure has the outer edge portion of the upper surface of the package contact part 730 that remains without being coupled to the body part 710 of the vacuum picker 700. Therefore, silicone oil or the like, which is eluted from the body part 710 made of silicone or rubber, remains on the outer edge portion of the upper surface of the package contact part 730, which makes it possible to prevent the sticky phenomenon in which the silicone oil flows between the package contact part 730 and the lower package 10 and the lower package 10 adheres to the vacuum picker 700. Therefore, it is possible to easily detach the lower package 10.

The socket contact part 740 is coupled to the upper surface of the body part 710. The socket contact part 740 is a portion inserted into the mounting groove 64 of the upper socket 60 and coupled to the upper socket 60. The socket contact part 740 is shaped such that the third vacuum hole 741 connected to the first vacuum hole 711 of the body part 710 is penetratively formed in a central portion of a circular plate.

The socket contact part 740 may have a larger width than the body part 710. The upper surface of the body part 710 is attached to the lower surface of the socket contact part 740. Therefore, because the socket contact part 740 is shaped to cover the upper surface of the body part 710, a diameter of the third vacuum hole 741 of the socket contact part 740 is equal to or smaller than a diameter of the first vacuum hole 711 of the body part 710. FIG. 7 exemplarily illustrates that the diameter of the third vacuum hole 741 of the socket contact part 740 is smaller than the diameter of the first vacuum hole 711 of the body part 710.

The socket contact part 740 may be made of a hard anti-adhesion material such as polyimide film, engineering plastic, or synthetic resin.

Because the socket contact part 740 made of a hard material is provided on the upper surface of the body part 710 made of silicone or rubber, it is possible to reduce the extent to which the body part 710 is shrunk because of the repeated use of the vacuum picker 700. Therefore, the vacuum picker 700 may stably pick up the lower package 10 without a pick-up error, and thus a lifespan of the vacuum picker 700 may be extended. To this end, a thickness t3 of the socket contact part may be a thickness of 3% or more of the overall thickness t of the vacuum picker 700.

The vacuum picker 700 configured as described above is attached and coupled to the mounting groove 64 of the upper socket 60 by means of the adhesive tape 81 such as a double-sided tape. As illustrated in FIG. 8, the adhesive tape 81 is attached to the mounting groove 64 of the vacuum picker 700 first, and then the socket contact part 740 of the vacuum picker 700 is inserted into the mounting groove 64, such that the socket contact part 740 is attached to the adhesive tape 81, and the vacuum picker 700 is coupled to the upper socket 60.

This configuration will be described in more detail. As illustrated in FIG. 9, the adhesive tape 81 has a width w2 smaller than a width w1 of the mounting groove 64 and is attached to the central portion of the mounting groove 64. The socket contact part 740 of the vacuum picker 700 has a width equal to the width w1 of the mounting groove 64 and is coupled to the upper socket 60 by being attached to the adhesive tape 81 in the mounting groove 64.

The mounting groove 64 formed in the lower surface of the upper socket 60 has a depth that accommodates the adhesive tape 81 and the socket contact part 740 of the vacuum picker. A depth t1 of the mounting groove 64 may be larger than a sum of a thickness t2 of the adhesive tape 81 and a thickness t3 of the socket contact part 740. As the depth of the mounting groove 64 increases as described above, the vacuum picker 700 may be more securely mounted on the upper socket 60.

Because the adhesive tape 81 also contains a sticky oil substance, the adhesive tape 81 may be pushed toward the edge portion of the mounting groove 64 when the vacuum picker 700 is used repeatedly. If the sticky oil substance eluted from the adhesive tape 81 pushed toward the edge portion flows along the vacuum picker 700 and flows toward the upper surface of the lower package 10, a sticky phenomenon may occur in which the lower package 10 adheres to the vacuum picker 700.

Therefore, in the embodiment of the present disclosure, the adhesive tape 81 having the width w2 smaller than the width w1 of the mounting groove 64 is attached to the central portion of the mounting groove 64, and the socket contact part 740 having the width equal to the width w1 of the mounting groove 64 covers the adhesive tape 81 having the small width, which makes it possible to prevent the sticky oil substance eluted from the adhesive tape 81 from deviating from the upper surface of the socket contact part 740. Therefore, it is possible to assuredly prevent the sticky phenomenon in which the lower package 10 adheres to the vacuum picker 700 by the sticky oil substance of the adhesive tape 81.

Figure 10:
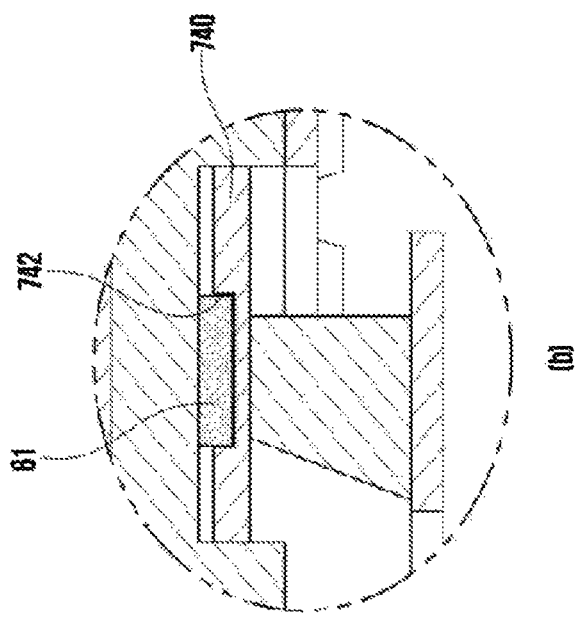
FIG. 10 is a partially enlarged view illustrating a coupling relationship between the upper socket and the vacuum picker according to another embodiment of the present disclosure.
Figure 10:
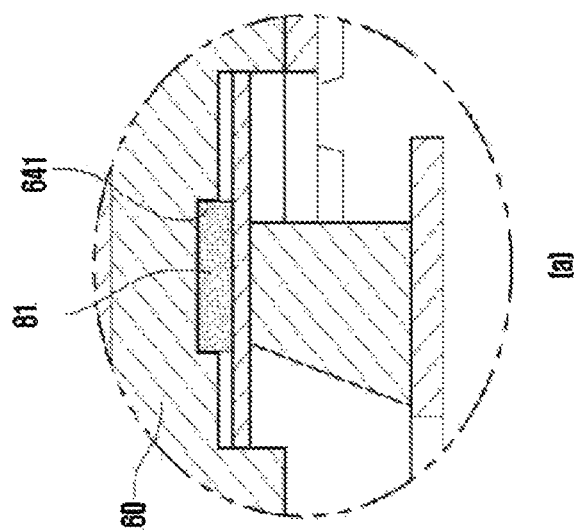

FIG. 10 is a partially enlarged view illustrating a coupling relationship between the upper socket and the vacuum picker according to another embodiment of the present disclosure.

When the vacuum picker 700 is used repeatedly, the adhesive tape 81 may be pushed from the center of the mounting groove 64. To prevent this problem, as illustrated in FIG. 10A, a first tape accommodation groove 641 may be provided by forming a groove in the central portion of the mounting groove 64 of the upper socket 60. Alternatively, as illustrated in FIG. 10B, a second tape accommodation groove 742 may be provided by forming a groove in the central portion of the upper surface of the socket contact part 740.

The first tape accommodation groove 641 or the second tape accommodation groove 742 is formed to accommodate a part of the thickness t2 of the adhesive tape 81. Because the adhesive tape 81 is securely attached to the first tape accommodation groove 641 or the second tape accommodation groove 742, the adhesive tape 81 is not pushed outward from the center of the mounting groove 64 even though the vacuum picker 700 is used repeatedly. Because a part of the sticky oil substance eluted from the adhesive tape 81 is accommodated in the first tape accommodation groove 641 or the second tape accommodation groove 742, a leak of oil may be reduced. Therefore, it is possible to more assuredly prevent the sticky oil substance, which is eluted from the adhesive tape 81, from flowing toward a lower side of the vacuum picker 700.

In addition, although not illustrated in the drawings, the first tape accommodation groove 641 may be provided in the central portion of the mounting groove 64 of the upper socket and the second tape accommodation groove 742 may be provided in the upper surface of the socket contact part 740 that faces the first tape accommodation groove 641, such that the adhesive tape 81 may be disposed in the first tape accommodation groove 641 and the second tape accommodation groove 742.

As described above, in the test apparatus 200 according to the embodiment of the present disclosure, the vacuum picker 700 is attached and coupled to the mounting groove 64 of the upper socket 60 by means of the adhesive tape 81 such as a double-sided tape. Therefore, because the vacuum picker 700 may be easily coupled to the upper socket 60, the convenience of coupling the vacuum picker 700 may be improved. Further, when any one of the upper socket and the vacuum picker 700 has a defect, only the component having the defect may be replaced, which makes it possible to reduce replacement costs.

Next, an operation of the apparatus for testing a package-on-package type semiconductor package according to the embodiment of the present disclosure will be described. FIG. 5 is a view for explaining an operation of the apparatus for testing a package-on-package type semiconductor package.

As illustrated in FIG. 5A, the pusher 50 is moved by the drive part, the vacuum picker 700 is moved downward and picks up the lower package 10, and then the vacuum picker 700 transports the picked lower package 10 to a location above the lower socket 40, such that the lower terminal 11 of the lower package 10 is disposed to be in contact with the first conductive part 41 of the lower socket 40.

Thereafter, as illustrated in FIG. 5B, when the pusher 50 moves toward the lower socket the vacuum picker 700 pushes the lower package 10 while being compressed, such that the lower terminal 11 of the lower package 10 is connected to the first conductive part 41 of the lower socket 40, and the second conductive part 61 of the upper socket 60 is connected to the upper terminal 12 of the upper package 10 by the movement of the pusher 50. In this case, a pressing force of the pusher 50 is transmitted to the lower package 10 through the upper socket such that the tester 30, the lower socket 40, the lower package 10, the upper socket 60, and the upper package 20 are electrically connected. In this state, the test signal generated from the tester 30 is transmitted to the lower package 10 and the upper package 20, such that the electrical test may be performed to identify whether the lower package 10 operates normally and whether the lower package 10 is properly matched with the upper package 20.

After the test is completed, the vacuum picker 700 moves upward, and the lower package 10 picked by the vacuum picker 700 may be easily unloaded from the lower socket 40 by the motion of the pusher 50 without a sticky phenomenon and then transferred to the loading device (not illustrated). As described above, according to the apparatus for testing a semiconductor package according to the embodiment of the present disclosure, the lower package does not adhere to the vacuum picker even when the package-on-package type semiconductor package is tested. Therefore, after the test, the completely tested lower package may be easily placed on the loading device, such that the entire test process may be efficiently performed.

While the present disclosure has been illustrated and described above with reference to the exemplary embodiments for illustrating the principle of the present disclosure, the present disclosure is not limited to the configurations and operations as illustrated and described. Those skilled in the art will be able to understand that many alterations and modifications may be made to the present disclosure without departing from the spirit and scope of the inventions described herein.

EXPLANATION OF REFERENCE NUMERALS

10: Lower package
20: Upper package
30: Tester
40: Lower socket
50: Pusher
60: Upper socket
62: Insulation pad
63: Insulation pad hole
64: Mounting groove
70, 700: Vacuum picker
81: Adhesive tape
100, 200: Apparatus for testing semiconductor package
641, 742: Tape accommodation groove
710: Body part
711, 731, 741: Vacuum hole
730: Package contact part
740: Socket contact part

The invention claimed is:

1. An apparatus for testing a package-on-package (POP) type semiconductor package, the apparatus comprising:
　a lower socket mounted on a tester and configured to be connected to a lower package placed at an upper side thereof;
　an upper socket mounted on a pusher and configured to mount an upper package, the upper socket being configured to be connected to the lower package placed below the upper socket;
　a vacuum picker coupled to the upper socket and configured to pick up the lower package; and
　an adhesive tape located between the vacuum picker and the upper socket;
　wherein a lower surface of the upper socket has an insulation pad hole, and a mounting groove that is spaced apart from the insulation pad hole and surrounds the insulation pad hole;
　wherein the vacuum picker has vacuum holes that communicate with the insulation pad hole,
　wherein the vacuum picker comprises:
　　a body part made of silicone or rubber;
　　a socket contact part coupled to a surface of the body part facing the upper socket; and
　　a package contact part coupled to a surface of the body part facing the lower package;
　　wherein the adhesive tape is attached to a bottom surface of the mounting groove;
　　wherein the socket contact part is located at least partially in the mounting groove and attached to the bottom surface of the mounting groove by the adhesive tape, such that the vacuum picker is coupled to the upper socket; and
　　wherein the socket contact part and the package contact part are made of any one of polyimide film, engineering plastic, and synthetic resin.

2. The apparatus of claim 1, wherein the adhesive tape has a width smaller than a width of the mounting groove, and the socket contact part has a width equal to the width of the mounting groove.

3. The apparatus of claim 1, wherein the adhesive tape is attached to a central portion of the mounting groove.

4. The apparatus of claim 1, wherein a first tape accommodation groove is formed in a central portion of the mounting groove and accommodates a part of a thickness of the adhesive tape.

5. The apparatus of claim 1, wherein a second tape accommodation groove is formed in a central portion of an upper surface of the socket contact part and accommodates a part of a thickness of the adhesive tape.

6. The apparatus of claim 1, wherein a depth of the mounting groove is larger than a sum of a thickness of the adhesive tape and a thickness of the socket contact part.

7. The apparatus of claim 1, wherein an area of the package contact part is 5% or more of an area of an upper surface of the lower package.

\* \* \* \* \*